(12) United States Patent
Osborn et al.

(10) Patent No.: US 10,459,039 B1
(45) Date of Patent: Oct. 29, 2019

(54) SYSTEMS AND METHODS FOR TESTING MULTI-ELEMENT LIGHTED DISPLAYS

(71) Applicant: Capital One Services, LLC, McLean, VA (US)

(72) Inventors: Kevin Osborn, Newton, MA (US); Tyler Locke, Washington, DC (US); David Kelly Wurmfeld, Falls Church, VA (US)

(73) Assignee: CAPITAL ONE SERVICES, LLC, McLean, VA (US)

( * ) Notice: Subject to any disclaimer, the term of this patent is extended or adjusted under 35 U.S.C. 154(b) by 0 days.

(21) Appl. No.: 15/959,455

(22) Filed: Apr. 23, 2018

(51) Int. Cl.
| | |
|---|---|
| *G01R 31/00* | (2006.01) |
| *G01R 31/26* | (2014.01) |
| *G01R 33/12* | (2006.01) |
| *G01N 27/72* | (2006.01) |
| *G01N 27/82* | (2006.01) |
| *G01R 31/44* | (2006.01) |
| *G01J 1/44* | (2006.01) |
| *G01J 1/42* | (2006.01) |

(52) U.S. Cl.
CPC ............ *G01R 31/44* (2013.01); *G01J 1/4228* (2013.01); *G01J 1/44* (2013.01); *G01J 2001/4252* (2013.01)

(58) Field of Classification Search
CPC ........ G01R 31/00; G01R 31/26; G01R 33/12; G01N 27/72; G01N 27/82; H04B 33/08
See application file for complete search history.

(56) References Cited

U.S. PATENT DOCUMENTS

| | | | |
|---|---|---|---|
| 5,764,209 A | 6/1998 | Hawthorne et al. | |
| 5,812,102 A | 9/1998 | Sprole, Jr. et al. | |
| 2002/0067184 A1* | 6/2002 | Smith | G02F 1/1309 324/760.01 |
| 2004/0196049 A1* | 10/2004 | Yano | G09G 3/2085 324/523 |
| 2008/0205482 A1* | 8/2008 | Cao | G01K 7/01 374/178 |
| 2013/0162283 A1* | 6/2013 | Wang | G01J 1/0214 324/762.07 |
| 2013/0301050 A1* | 11/2013 | Tseng | G01J 3/28 356/402 |
| 2014/0062491 A1* | 3/2014 | Farley | H05B 33/0818 324/414 |
| 2016/0276328 A1* | 9/2016 | Robin | H01L 25/167 |

* cited by examiner

*Primary Examiner* — Neel D Shah
(74) *Attorney, Agent, or Firm* — Finnegan, Henderson, Farabow, Garrett & Dunner, LLP

(57) ABSTRACT

Systems and methods for testing a light emitting display unit having a plurality of light emitting elements are disclosed. Embodiments include a system with a test module, the test module including a plurality of light detection elements. Each of the plurality of light detection elements may generate a signal upon detection of light emitted from a light emitting element. The test module may also include a circuit. The circuit may receive input signals from the plurality of light detection elements, process the input signals based on a pre-determined function of the circuit, and generate an aggregate output signal based on the processing of the input signals. The circuit may also process the input signals based on discrete implementation of a combinational logic. The circuit may further receive instructions determining the combinational logic to be implemented.

19 Claims, 6 Drawing Sheets

SYSTEMS AND METHODS FOR TESTING MULTI-ELEMENT LIGHTED DISPLAYS

TECHNICAL FIELD

The present disclosure relates generally to a system and method for testing lighted displays, and more particularly, to a system and method for testing multi-segmented lighted displays by testing display elements in parallel.

BACKGROUND

Large screen displays or multi-element lighted displays for the presentation of time-dependent images such as videos have become more common in recent years. Many such displays are used in fixed locations such as at sporting grounds, or in temporary locations for special events such as at concerts or large public gatherings. Multi-element lighted displays are also commonly used as indicators on printed circuit board (PCB) assemblies.

PCBs, for use in computers and other electronic assemblies, include many light sources, typically light emitting diodes (LEDs). It is common practice to test circuits and components of a PCB assembly, including display elements, by routing signals from light detection elements that detect the light emitted by the display elements to a test fixture. Test signals are applied to the PCBs, and voltages generated across the various components and key parts of the circuit are monitored for verifying the operational characteristics of the components and the circuit. Though this method can provide high throughput in testing of display elements, it can be very time consuming and expensive when the number of displays is large, particularly when multiple PCBs are tested at the same time. In particular, the amount of data to be analyzed can be large for a display utilizing multiple light emitting elements.

Other types of automatic vision testing systems, which test for both the electrical and optical characteristics of LEDs on a printed circuit board are also available. Typically, such vision testing systems rely on a video camera and a frame grabber. The video camera images the printed circuit board, and the frame grabber grabs an image of the printed circuit board when the LEDs are powered up. The image is subsequently processed and interpreted by a computer. However, such automatic vision testing systems tend to be relatively expensive, relatively large, and unwieldy. Additionally, because the image of the printed circuit board grabbed from the video camera contains a significant amount of redundant information, relatively sophisticated algorithms and relatively large amounts of computer processing power are required to extract the relevant data from the image to verify that the LEDs are operational.

While it is common to employ a variety of other optical testing methods such as advanced imaging techniques using infra-red cameras, these methods can suffer from scalability issues because of angle-of-view considerations for multiple PCB assemblies, and because of the physical room/layout of multiple PCB assemblies. Such optical testing methods of display elements on PCBs or PCB assemblies are far from error proof, and miscalculations and undetected faulty devices could be harmful in certain situations, for example, if a user relies on an LED mounted on a PCB configured to indicate excessive applied voltage to a circuit or a circuit component, and if the failure of the LED is undetected, significant damage could be potentially caused to the circuit and/or the user.

PCB assemblies with display elements are often tested by routing signals from photodetectors to test equipment or using high-resolution cameras and computer vision. Large displays with high definition and resolution have a higher number of densely packed LEDs. As a result, testing such large displays can be quite complex. Moreover, if a single element of a multi-element display fails, the whole PCB assembly is rejected and sent for rework. Additionally, testing a large number of LEDs requires an enormous amount of computing resources and can be very time consuming.

The disclosed system and methods for testing multi-element lighted displays, address one or more of the problems set forth above and/or other deficiencies in the prior art.

SUMMARY

One aspect of the present disclosure is directed to a system for testing a light emitting display unit having a plurality of light emitting elements. The system may include a test module, including a plurality of light detection elements. Each of the plurality of light detection elements may be configured to generate a signal upon detection of light emitted from a light emitting element. The test module may also include a circuit configured to receive input signals from the plurality of light detection elements, process the input signals based on a pre-determined function of the circuit, and generate an aggregate output signal based on the processing of the input signals. The aggregate output signal is configured to determine whether the light emitting display unit is functioning. The circuit may be further configured to process the input signals based on discrete implementation of a combinational logic. The circuit may be further configured to receive instructions for determining the combinational logic to be implemented.

Another aspect of the present disclosure is directed to a method for testing a light emitting display unit having a plurality of light emitting elements. The method may include generating a signal from each of a plurality of light detection elements upon detection of light emitted from a light emitting element. The method may also include receiving, via a circuit, input signals from the plurality of light detection elements, processing, via the circuit, the input signals based on a pre-determined function of the circuit, and generating, via the circuit, an aggregate output signal based on the processing of the input signals. The aggregate output signal is configured to determine whether the light emitting display unit is functioning. The method may further include processing the input signals based on discrete implementation of a combinational logic. In some embodiments, the method may include receiving instructions for determining the combinational logic to be implemented. The aggregate output signal may be configured to indicate a characteristic of the tested light emitting display unit, and the aggregate output signal may include an electrical signal or an optical signal.

In some embodiments, the method may include aligning each light detection element of the plurality of light detection elements with the corresponding light emitting element.

Yet another aspect of the present disclosure is directed to a system for testing light emitting display unit having a plurality of light emitting elements. The system may include a plurality of light detection elements. Each of the plurality of light detection elements may be configured to generate a signal upon detection of light emitted from a light emitting element. The system may also include a combinational logic circuit configured to receive input signals. The input signals may include electrical signals generated from each of the plurality of light detection elements. The combinational logic circuit may be further configured to process the input signals based on a pre-determined function of the combinational logic circuit, and generate an aggregate output signal based on the processing of the input signals.

In some embodiments, the aggregate output signal may be configured to indicate a characteristic of the tested light emitting display unit. The aggregate output signal is configured to determine whether the light emitting display unit is functioning. The aggregate output signal may include an electrical signal or an optical signal.

In some embodiments, the test module includes a plurality of light pipes configured to transport light emitted from each of the plurality of light emitting elements to the plurality of light detection elements. The test module may also include a circuit board, a printed circuit board, or a printed circuit board assembly.

In some embodiments, the circuit board, during testing, may be positioned such that each light detection element of the plurality of light detection elements of the test module is aligned with the corresponding light emitting element.

In some embodiments, the electronic circuit includes an electronic circuit or an optical circuit. The electronic circuit may include a combinational logic circuit, a field-programmable gate array including one or more logic gates, a multiplexer, a programmable logic device, or a microprocessor.

In some embodiments, the plurality of light detection elements may include phototransistors, photodiodes, photo-bipolar transistors, or photomultiplier tubes.

It is to be understood that both the foregoing summary and the following detailed description are exemplary and explanatory only and are not restrictive of the disclosed embodiments as claimed.

BRIEF DESCRIPTION OF THE DRAWINGS

The accompanying drawings, which are incorporated in and constitute a part of this specification, illustrate disclosed embodiments and, together with the description, serve to explain the disclosed embodiments. In the drawings.

DETAILED DESCRIPTION

The present disclosure is generally directed to systems and methods for testing a light emitting display unit having a plurality of light emitting elements. The system may include a test module, including a plurality of light detection elements. Each of the plurality of light detection elements may be configured to generate a signal upon detection of light emitted from a light emitting element. The test module may also include a circuit configured to receive input signals from the plurality of light detection elements, process the input signals based on a pre-determined function of the circuit, and generate an aggregate output signal based on the processing of the input signals. The circuit may be further configured to process the input signals based on discrete implementation of a combinational logic. The circuit may be configured to receive instructions determining the combinational logic to be implemented.

The method may include generating a signal from each of a plurality of light detection elements upon detection of light emitted from a light emitting element. The method may also include receiving, via a circuit, input signals from the plurality of light detection elements; processing, via the circuit, the input signals based on a pre-determined function of the circuit; and generating, via the circuit, an aggregate output signal based on the processing of the input signals. The method may further include processing the input signals based on discrete implementation of a combinational logic. In some embodiments, the method may include receiving instructions determining the combinational logic to be implemented. The aggregate output signal may be configured to indicate a characteristic of the tested light emitting display unit, and the aggregate output signal may include an electrical signal or an optical signal.

Reference will now be made in detail to the disclosed embodiments, examples of which are illustrated in the accompanying drawings.

Figure 1:
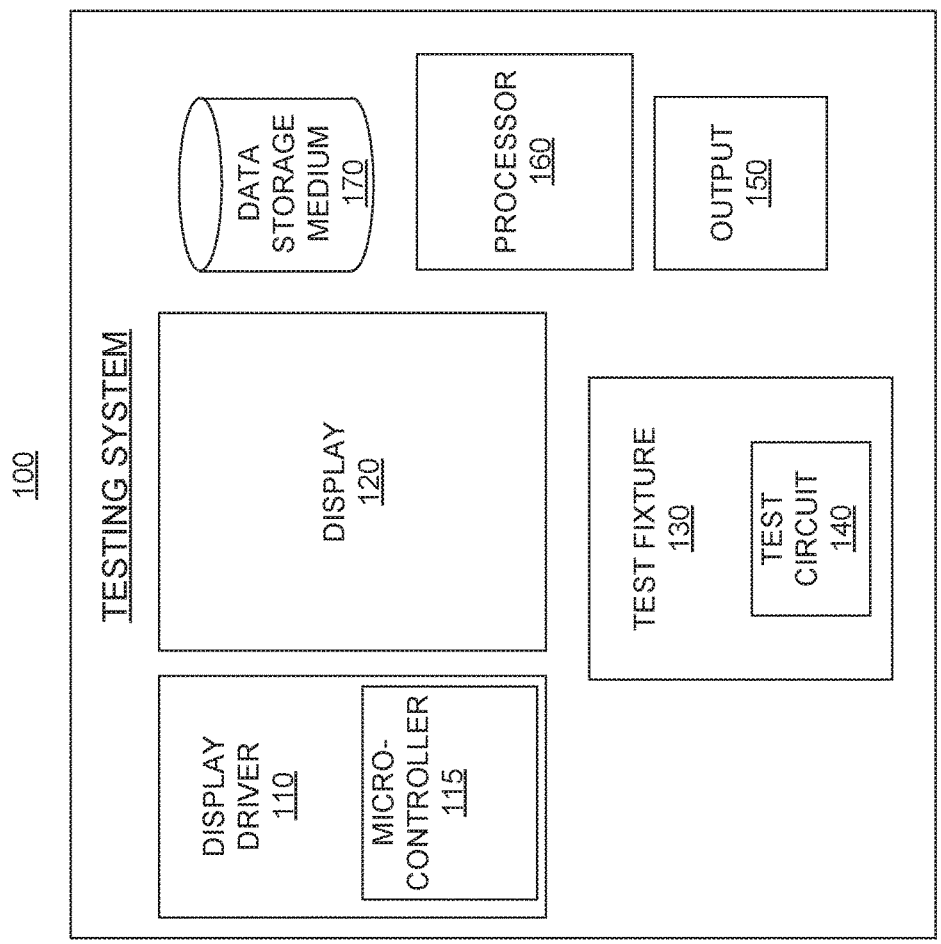
FIG. 1 shows a block diagram of an exemplary testing system, consistent with disclosed embodiments.

FIG. 1 is a block diagram of an exemplary testing system 100 for testing multi-element lighted displays, consistent with disclosed embodiments. Testing system 100 may include a display driver 110, a microcontroller 115, a display 120, a test fixture 130, a test circuit 140, an output 150, a processor 160, and data storage medium 170. Testing system 100 may also include other components, not shown in FIG. 1, for example, one or more databases to store data, instructions, or input signals etc., a network configured to connect elements of testing system 100 to each other through the network, or the like. Although FIG. 1 illustrates only one of each of display driver 110, display 120, test fixture 130, test circuit 140, output 150, processor 160, and data storage medium 170, it is contemplated that testing system 100 may include any number of display drivers 110, displays 120, test fixtures 130, test circuits 140, outputs 150, processors 160, and/or data storage media 170.

In some embodiments, as shown in FIG. 1, display driver 110 may be a control circuit configured to control the operation of display 120. Display driver 110 may include a circuit for current generation to control output currents from a plurality of current sources. Display driver 110 may also include one or more sources for supplying pre-determined voltage, current switching circuits, current wiring connecting the plurality of current sources to the current switching circuits, one or more operational amplifiers to accurately determine the current outputs from the current sources, and the like.

In some embodiments, display driver 110 may be configured to be operated by microcontroller 115. Microcontroller 115 may be pre-programmed to apply appropriate test signals to selectively activate one or more light emitting sources of display 120. The microcontroller may also be configured to apply appropriate test signals to test other components and circuitry of display driver 110. In other embodiments, display driver 110 may be directly controlled through a software program configured to apply test signals based on user-preference or pre-determined algorithms. Alternatively, the microcontroller may execute the software program to apply test signals for testing components and circuits of display driver 110. Other possible combinations using microcontroller and software programs to control display driver 110 may be employed.

Referring to FIG. 1, display 120 may include a plurality of light sources arranged in a rectangular matrix, in a circular matrix, in a specific pattern, or arranged randomly. Display 120 may be a static dot-matrix display, an animated dot-matrix display, or a multi-segmented display, for example, a seven-segment display, a nine-segment display, a fourteen-segment display, or a sixteen-segment display. Some of the common applications of multi-segmented displays include car stereos, microwave ovens, slot machines, DVD players, and calculators. In some embodiments, each segment of a multi-segmented display may be a single LED.

In some embodiments, the light sources of display 120 may be LEDs, liquid crystal displays (LCDs), vacuum fluorescent devices, electroluminescent devices, photo-luminescent devices, or the like. Display 120 can include, for example, an LCD display panel, a LED display panel, a PCB with LEDs, or multiple PCBs with LEDs.

Testing system 100 may include test fixture 130 and test circuit 140. Test circuit 140 may be integrated with test fixture 130 or test circuit 140 may be a separate unit configured to operate elements of test fixture 130. In some embodiments, test fixture 130 may include a printed circuit board or a printed circuit board assembly equipped with light detecting elements configured to detect light emitted by light sources in display 120 or by one or more devices under test.

In some embodiments, test circuit 140 may be integrally connected to test fixture 130. Test circuit 140 may include preprogrammed circuitry to operate elements of test fixture 130 and/or analyze the test performance of display 120. In some embodiments, test circuit 140 may include an electrical circuit, or an electronic circuit, or an optical circuit or any combinations thereof. The electrical or electronic circuit may include one or more of resistors, capacitors, inductors such as transformer or coils, transistors, diodes, sensors, etc. The optical circuit may include electrical or electronic circuit components combined with optical components such as mirrors, lens, optical filters, etc.

Test circuit 140 may include one or more combinational logic circuits, field-programmable gate arrays including logic gates, multiplexers, programmable logic devices, or microprocessor circuits, or any combinations thereof. A combinational logic circuit may be implemented discretely or in combination with a complex programmable logic device (CPLD), or a field programmable gate array (FPGA), or a microprocessor.

Referring to FIG. 1, testing system 100 may also include one or more outputs 150. Output 150 is configured to process and/or relay the test results of display 120 determined by test circuit 140. Output 150 may include a visual notification, a voice prompt, an electrical signal to activate a switch, an optical signal, or the like. In some embodiments, output 150 may be configured to generate an output based on the output signal generated by test circuit 140.

In some embodiments, testing system 100 may include one or more processors 160. Processor 160 may include one or more known processing devices, such as, but not limited to, microprocessors from the Pentium™ or Xeon™ family manufactured by Intel™, the Turion™ family manufactured by AMD™, or any of various processors from other manufacturers. In some embodiments, processor 160 may execute software instructions or hardware instructions to perform functions in accordance with the disclosure.

Processor 160 may execute one or more computer programs configured to control one or more of display drivers 110 or displays 120. Processor 160 may also execute one or more computer programs configured to operate one or more of test fixtures 130 or test circuits 140. Processor 160 may be the central processing unit of testing system 100 configured to control and operate testing system 100 and all of its components.

As shown in FIG. 1, testing system 100 may include one or more data storage media 170. Data storage medium 170 may be configured to store data related to testing system 100. For example, test results of display 120 may be stored temporarily to be displayed on output 150 at a later stage or information about display being tested.

In some embodiments, data storage medium 170 may be configured to store instructions for processor 160 to control one or more of display drivers 110, displays 120, test fixtures 130, test circuits 140, outputs 150. Data storage medium 170 may further be configured to be accessed by one or more processors 150 to generate a test report including relevant details such as time, duration, test results, and the like.

Figure 2:
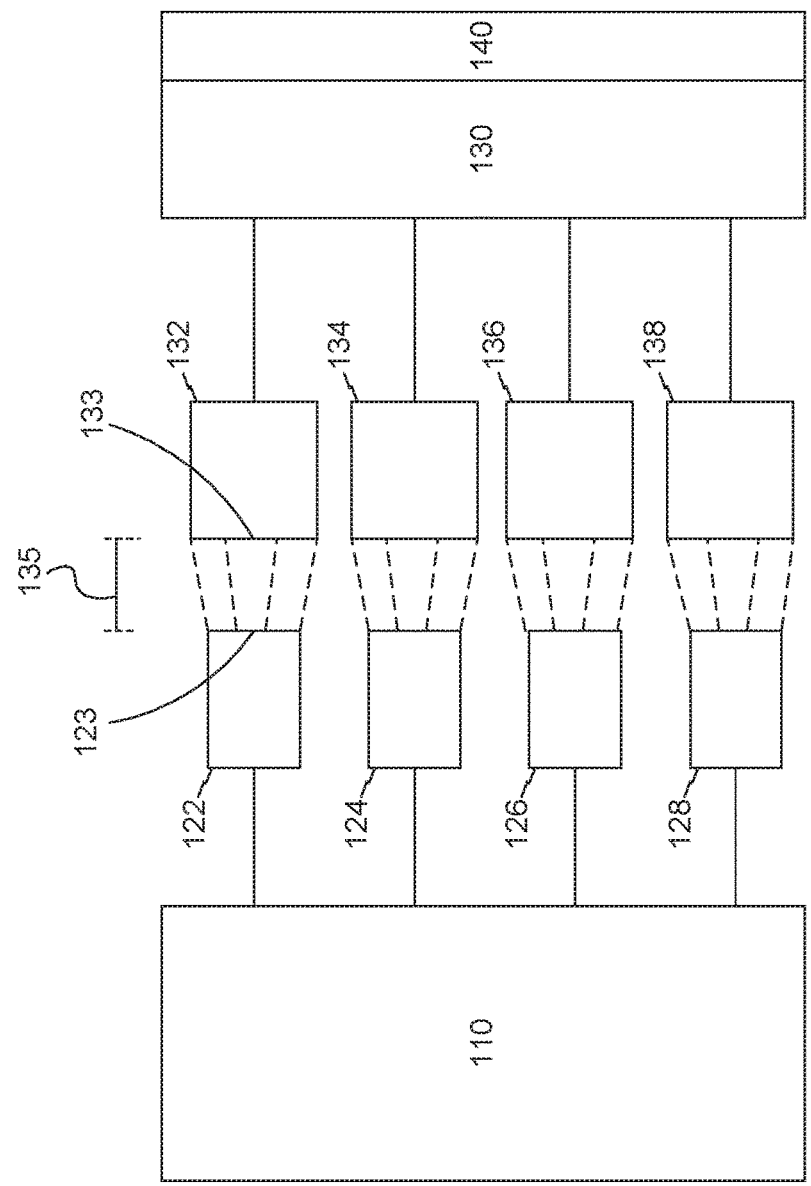
FIG. 2 shows a block diagram of an exemplary testing system including light emitting elements and light detection elements, consistent with disclosed embodiments.

FIG. 2 shows a block diagram of portions of an exemplary testing system 100. Display driver 110 may be configured to operate and/or control one or more light emitting elements, for example, 122, 124, 126, and 128 of display 120. Light emitting elements 122, 124, 126, and 128 may be LEDs mounted on a PCB or a PCB assembly (PCBA), or LEDs representing individual segments of a multi-segmented display, or LCDs representing individual segments of a multi-segmented display. In some embodiments, light emitting elements such as LEDs, for example, 122, 124, 126, and 128 may be arranged in a rectangular array, a circular array, randomly arranged, or any combination thereof. In a rectangular array arrangement, the LEDs may be evenly spaced or unevenly spaced. In a circular array the LEDs may be arranged in concentric circles or non-concentric circles.

Test fixture 130 may include one or more light detection elements, for example, 132, 134, 136, and 138. Light detection elements 132, 134, 136, and 138 may include phototransistors, photodiodes, photobipolar transistors, or photomultiplier tubes. As illustrated in FIG. 2, light detection element 132, for example, may be positioned at an optimum distance 135 from light emitting source 122, such that light detection element 132 captures a majority of the light emitted by light emitting element 122 without interference from light emitted from a neighboring light emitting element (for example, LED 124). Optimum distance 135 may be a distance between light emitting surface 123 of light emitting element 122 and light detecting surface 133 of light detection element 132. In exemplary embodiments, optimum distance 135 may be 1 mm or less, 2 mm or less, 5 mm or less, 10 mm or less, 20 mm or less, 30 mm or less, 40 mm or less, 50 mm or less. In a preferred embodiment, optimum distance 135 may be 0.5 mm or less.

In some embodiments, as illustrated in FIG. 2, a light detecting surface 133 of light detection element 132 may be larger in dimension compared to light emitting surface 123 of light emitting source 122, to allow capturing a majority of the light emitted from light emitting source 122. Light detection elements, for example, 132, 134, 136, and 138 may be further aligned to detect light emitted from each of the corresponding light emitting elements 122, 124, 126, and 128, respectively.

In some embodiments, light emitting elements 122, 124, 126, and 128 may be LEDs used as indicators, mounted on a PCB or a PCBA such that light emitting surfaces 123 of two or more light emitting elements may be nonplanar. The positioning of individual light detection elements, for example, 132, 134, 136, and 138, can be adjusted accordingly to maintain optimum distance 135 from light emitting surface 123 of a corresponding light emitting element 122, 124, 126, or 128. Optimum distance 135, dimensions of light detecting surface 133, number of light detection elements 132, 134, 136, and 138, number of light emitting elements 122, 124, 126, or 128, and dimensions of light emitting surfaces 123 may determine a resolution of display 120 that can be tested.

In some embodiments, light detection elements, for example, 132, 134, 136, and 138, may include a photodiode or a phototransistor, which may be a semiconductor device that receives light (photons) and converts the electromagnetic energy into an electric current as the output signal. As illustrated in FIG. 2, light detection elements 132, 134, 136, and 138 may be coupled with test fixture 130. In some embodiments, light detection elements 132, 134, 136, and 138 may be disposed on test fixture 130. Alternatively, light detection elements 132, 134, 136, and 138 may not be disposed on test fixture 130 but instead may be electrically connected with test fixture 130 through electrical wiring.

Figure 3:
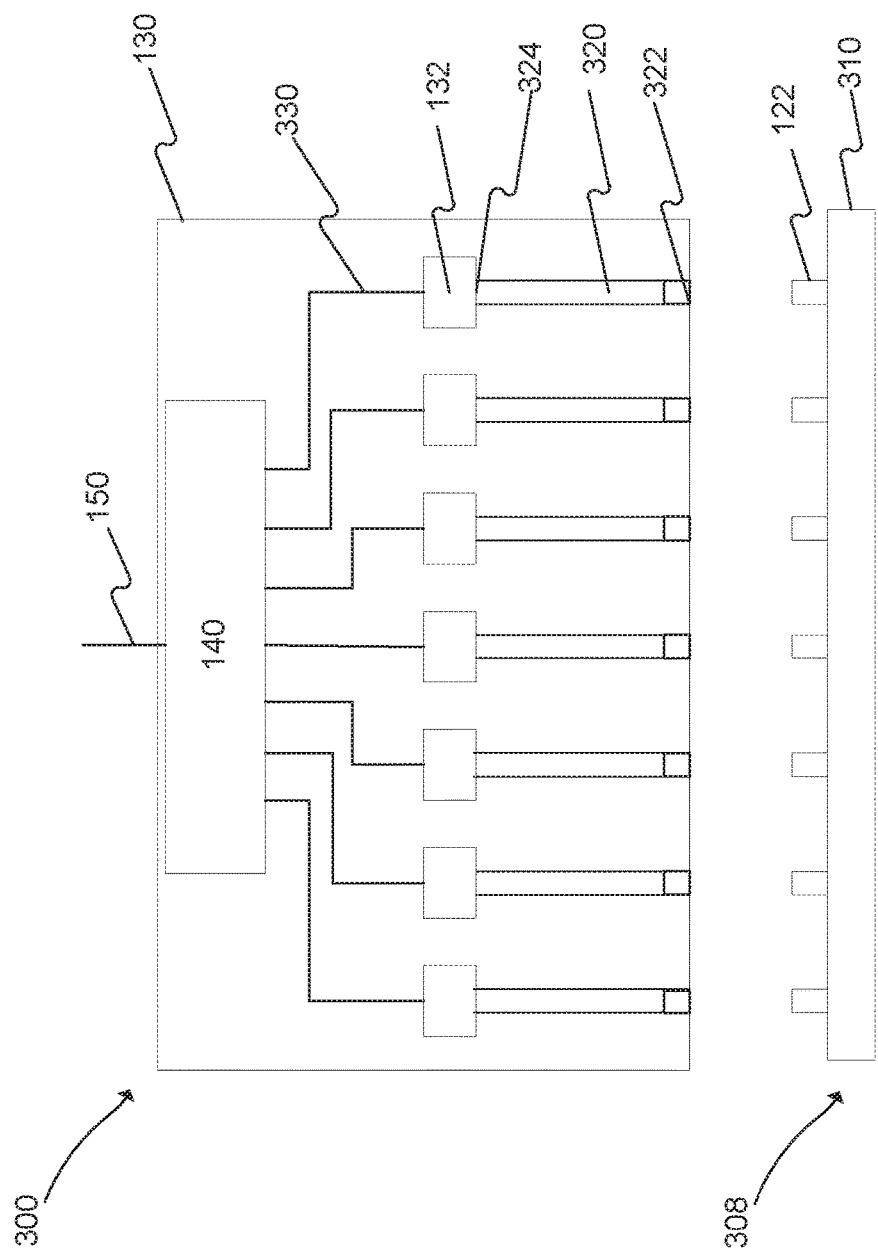
FIG. 3 illustrates an exemplary testing system including a display and a test fixture, consistent with disclosed embodiments.

FIG. 3 illustrates a portion of another exemplary testing system 300 including a display source 308 and test fixture 130. Display source 308 may include a carrier panel 310 and a plurality of light emitting elements. (for example, 122, 124, 126, or 128) The plurality of light emitting elements 122, 124, 126, or 128 may be mounted on carrier panel 310 with an even spacing or uneven spacing. Carrier panel 310 may comprise a PCB, a PCBA, a display backing plate, an array of PCBs an array of PCBAs, or the like. In some embodiments, carrier panel 310 may include at least display driver 110.

In some embodiments, test fixture 130 may include a plurality of light collectors 320, a plurality of light detection elements 132, a plurality of electrical wires 330 configured to electrically connect the light detection elements to test circuit 140. Light collectors 320 may include optical fibers, optical cables, light pipes, or the like. Optical fiber 320 may include a source end 322 and a detector end 324. Source end 322 may be positioned nearer to and in-line with light emitting element 122, and detector end 324 may be configured to terminate in light detection element 132. Each of the plurality of optical fibers 320 may be configured to collect and transport light from a corresponding LED 122 to a corresponding light detection element 132. Optical fibers 320 may provide lossless transportation of light (photons) from light emitting element 122 to light detection element 132.

In some embodiments, test fixture 130 may be stationary, while carrier panel 310 including the plurality of light emitting elements may be moveable. Carrier panel 310 may be moved nearer to or away from test fixture 130 to maintain a pre-determined optimum distance 135. Carrier panel 310 may be moved incrementally away from or nearer to test fixture 130 based on an intensity and/or a specificity of a signal generated by light detection elements (e.g. 132, 134, 136, or 138), when light emitted from light emitting source (e.g. 122, 124, 126, or 128) is detected.

In some embodiments, carrier panel 310 may be stationary, while test fixture 130 may be moveable. Test fixture 130 may be moved nearer to or away from carrier panel 310 to maintain a pre-determined optimum distance 135. Test fixture 130 may be moved incrementally away from or nearer to carrier panel 310 based on intensity and specificity of signal generated by light detection element 132 (or 134, 136, or 138), when light emitted from light emitting source (e.g. 122, 124, 126, or 128) is detected.

In some embodiments, test fixture 130 and carrier panel 310 may both be stationary, while optical fibers 320 may be moveable. Optical fibers 320 may be moved nearer to or away from carrier panel 310 to maintain a pre-determined optimum distance 135 between light emitting surfaces 123 and source ends 322 of optical fibers 320. Optical fibers 320 may be individually moved incrementally away from or nearer to carrier panel 310 based on an intensity and/or a specificity of a signal generated by light detection element 132 (or 134, 136, or 138), when light emitted from light emitting source (e.g. 122, 124, 126, or 128) is detected.

In some embodiments, optimum distance 135 for light emitting sources on carrier panel 310 may be determined based on characteristics of emitted light, for example, wavelength, intensity, saturation, hue, etc. In some embodiments, optimum distance 135 may be uniform for all light emitting sources on carrier panel 310. In other embodiments, optimum distance 135 may be non-uniform.

In some embodiments, test fixture 130 may comprise positioning bores configured to tightly engage and position optical fibers 320 with source ends 322 aligned with the light emitting elements (e.g. 122, 124, 126, or 128) and detector ends 324 aligned with the light detection elements (e.g. 132, 134, 136, or 138). Positioning bores may extend through the thickness or a portion of the thickness of test fixture 130. In some embodiments, positioning bores may be used as light paths or light cavities where light from the LEDs may be transported without optical fibers.

In some embodiments, aligning light detection element (e.g. 132, 134, 136, or 138) with light emitting element (e.g. 122, 124, 126, or 128) may include positioning light detection element (e.g. 132, 134, 136, or 138) relative to a corresponding light emitting element (e.g. 122, 124, 126, or 128) such that a majority of the light emitted by the light emitting element (e.g. 122, 124, 126, or 128) is captured. For example, the amount of light captured may be in the range of 80% or more, 85% or more, 90% or more, 95% or more, or 99% or more. In a preferred embodiment, amount of light captured by light detection elements is 99% or more.

In some embodiments, optical fibers (e.g., 320) may be configured to collect and transport light from light emitting elements (e.g. 122, 124, 126, or 128) to light detection elements (e.g. 132, 134, 136, or 138). Source end 322 of optical fibers (e.g., 320) may be aligned with light emitting surface (e.g., 123) of light emitting elements (e.g. 122, 124, 126, or 128) such that optical fibers (e.g. 320) collect a majority of the light emitted. The amount of light collected by optical fiber (e.g., 320) may be in the range of 80% or more, 85% or more, 90% or more, 95% or more, or 99% or more. In a preferred embodiment, amount of light captured by light detection elements is 99% or more.

In some embodiments, detector end 324 of optical fibers (e.g., 320) may be aligned with light detecting surface (e.g., 133) of light detection elements (e.g. 122, 124, 126, or 128) such that light detecting surface (e.g., 133) detects a majority of the light collected and transported by optical fiber 320. Detector end 324 may be aligned with light detecting surface (e.g. 133) by positioning detector end 324 relative to light detecting surface (e.g. 133) to allow light detecting surface (e.g., 133) to detect a majority of the light collected and transported by optical fiber 320.

Referring to FIG. 3, electrical wiring 330 may be configured to electrically connect light detection elements to test circuit 140. Electrical wiring 330 may include copper, silver, gold, or other suitable electrically conducting wires.

Figure 4:
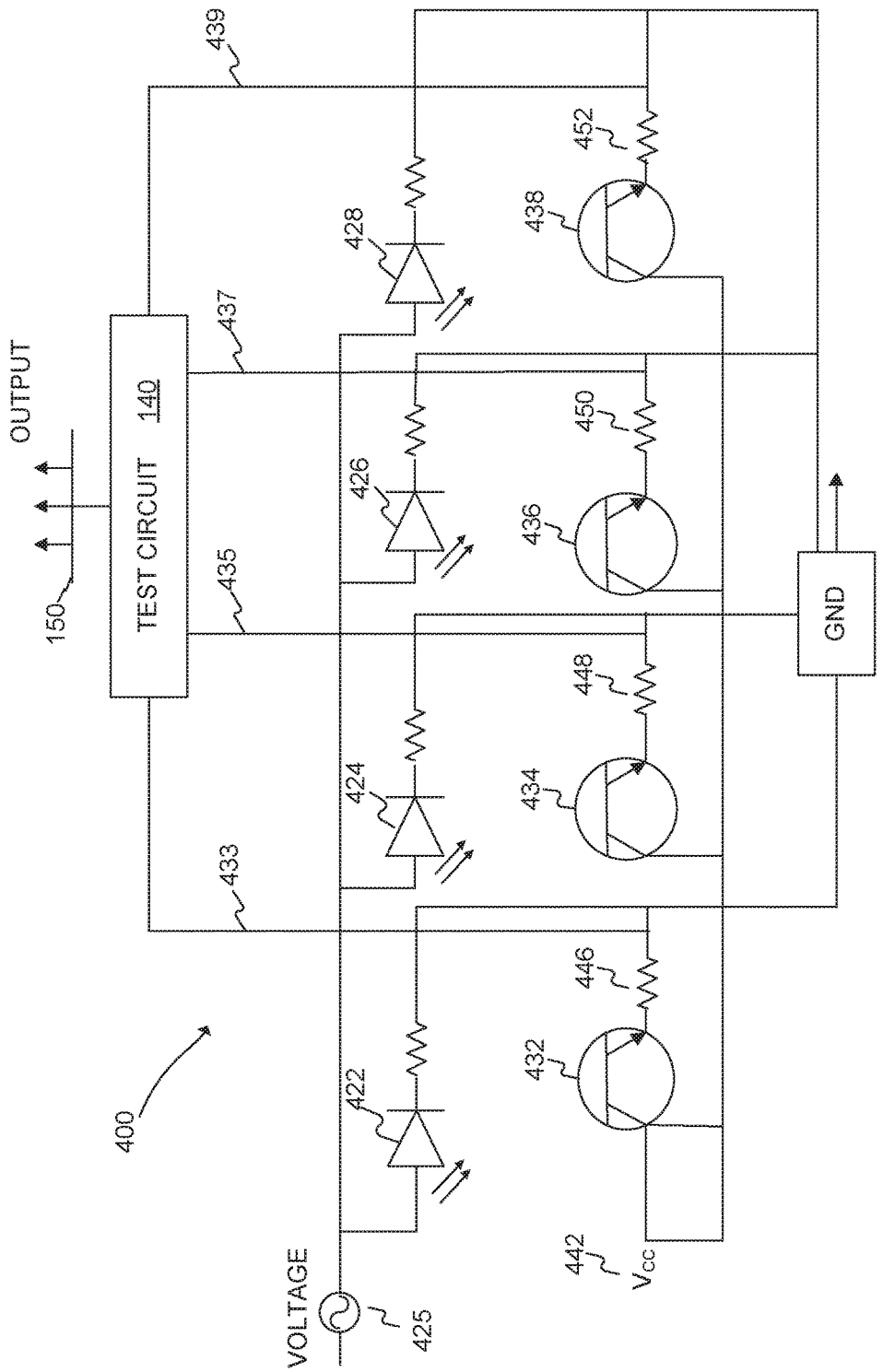
FIG. 4 is a schematic of an exemplary circuit for a testing system, consistent with disclosed embodiments.

FIG. 4 shows a schematic of circuit 400 of testing system 100. Circuit 400 may comprise display driver 110 (not shown in FIG. 4), LEDs 422, 424, 426, and 428, which may be electrically coupled to a common voltage source 452, phototransistors 432, 434, 436, and 438, which may be electrically coupled to a common voltage source 442 separate from voltage source 452 for LEDs 422, 424, 426, and 428, and test circuit 140. Although only four LEDs and phototransistors are illustrated in FIG. 4, it is understood that more or less LEDs and phototransistors may be used. Circuit 400 may also include other components, not shown, for example, inverters, filters, operational amplifiers, rectifiers, alternate power sources, etc.

A terminal of a phototransistor (e.g. 432, 434, 436, and 438) may be electrically coupled to a power supply that supplies a suitable source of d.c. voltage 442 to operate the phototransistor. A load resistor (e.g. 446, 448, 450, or 452) of a pre-determined resistance value may be electrically coupled between the terminal configured to receive power and electrical ground thereby to define an output voltage. Load resistors (e.g. 446, 448, 450, or 452) with suitable resistance values may be employed. A terminal of an LED (e.g. 422, 424, 426, and 428) may be electrically coupled to a power supply that supplies a suitable source of voltage to operate the LED.

In some embodiments, test circuit 140 may be configured to receive input signals from a plurality of light detection elements (432, 434, 436, and 438), process the received input signals based on a pre-determined function and generate an aggregate output signal 150 based on the received input signals. Test circuit 140 may be an electrical circuit comprising active components, for example, transistors, diodes, sensors, etc. in combination with passive components, for example, resistors, capacitors, inductors, etc. The light detection elements (432, 434, 436, and 438) may be electrically connected to test circuit 140 through electrical connectors (433, 435, 437, and 439). Electrical connectors (433, 435, 437, and 439) may include copper, silver, gold, or other suitable electrically conducting wires.

In some embodiments, test circuit 140 may be configured to process the input signals based on discrete implementation of combinational logic. Combinational logic, such as AND gates, OR gates, NOR gates, NAND gates, multiplexers, or encoders-decoders, may be implemented as discrete units that may not be inter-connected. Discrete units of combinational logic may also not be connected to a common processor or circuit. For example, a single multiplexer (shown later) may be configured to process the input signals from four phototransistors (e.g., 432, 434, 436, and 438) and generate an output signal 150.

In some embodiments, test circuit 140 may be configured to process the input signals based on a pre-determined function. Pre-determined function may include determining the wavelength of light emitted by alone or more LEDs on one or more printed circuit boards. In other embodiments, pre-determined function may include determining wavelength, intensity, and frequency of light emitted by one or more LEDs on one or more printed circuit boards.

Figure 5:
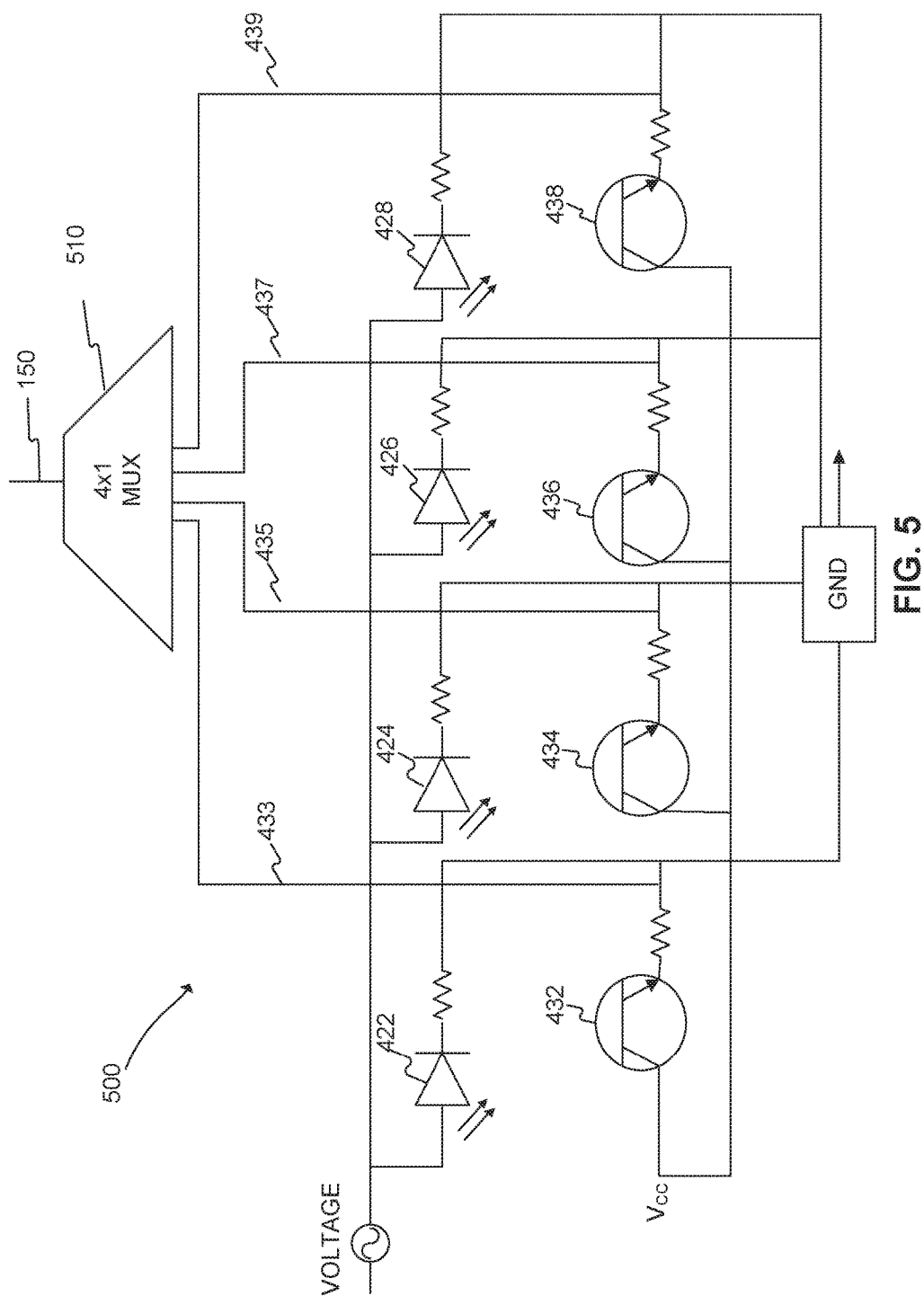
FIG. 5 is a schematic of another exemplary circuit for a testing system, consistent with disclosed embodiments.

In some embodiments, test circuit 140 may comprise a digital electronic circuit, for example, combinational logic circuit, as shown in FIG. 5. Combinational logic circuit may include multiplexers, encoder-decoders, or a combination of logic gates, or combinations thereof. In some embodiments, test circuit 140 may comprise an analog electrical circuit and digital electronic circuit.

In some embodiments, combinational logic may be implemented in combination with CPLD, FPGA, Application Specific Integrated Circuit (ASIC), or a microprocessor. In some embodiments, test circuit 140 may also include a machine learning or deep learning algorithm configured to determine predictable outcomes under a given set of conditions.

In some embodiments, FPGA may be an integrated circuit including one or more configurable logic blocks connected via programmable interconnects. FPGAs may also include input/output blocks, memory components, and sequential components, for example, flip-flops.

Combinational logic circuits, for example, may include one or more multiplexers 510 configured to receive input signals from light detection elements. Multiplexer 510 may comprise a single 4-channel multiplexer (as shown in FIG. 5), a single 8-channel multiplexer, two 8-channel multiplexers, a single 16-channel multiplexer, or the like. Multiplexer 510 may be a combinational logic circuit configured to switch one of the several input signals through to a common output signal by the application of a control signal. Multiplexer 510 may comprise a digital circuit including a combination of logic gates or an analog circuit including transistors, field-effect transistors, or relays to switch one of the voltage or current inputs through to a single output.

In some embodiments, output signals from multiplexers may further be fed into a logic gate. For example, testing system for a display or a PCB comprising 8 LEDs and 8 phototransistors may comprise test circuit 140, including two 4-channel multiplexers and one AND gate. Electrical signals generated from each of the phototransistors may be received as input signals by the two 4-channel multiplexers. A single output signal generated by each of the multiplexers may further be fed into an AND gate as an input signal, which is configured to generate an aggregate output signal.

In some embodiments, test circuit 140 may comprise an FPGA circuit, or a logic combiner, or a combination thereof. FPGA circuit may be pre-programmed to determine the light sources to be operated prior to testing. A logic combiner may comprise one or more logic gates, for example, one or more of AND gates, OR gates, NAND gates, and/or NOR gates, pre-programmed to test specific patterns on a display such as a multi-segmented display.

In some embodiments, test circuit 140 may include an optical circuit configured to test the characteristics of the light emitted by a light emitting source, for example, frequency, wavelength, or intensity, or a combination thereof. The optical circuit may include one or more of, for example, cross-polarization filters, low-pass filter, high-pass filter, wave amplifiers, optical waveguides, detectors, and/or attenuators. For example, a cross-polarization filter may be positioned in-line with the optical media source and the detector in the optical circuit may detect a frequency of the light being transferred through. Optical fibers 320 may be configured to transport light emitted from the light emitting source (e.g., 122, shown in FIG. 3) to the optical circuit. The optical circuit may be configured to receive the input signals, process the received input signals based on a pre-determined function and generate an aggregate output signal 150 based on the received input signals.

In some embodiments, test circuit 140 may include an electro-optical circuit, which may include, for example, one or more of electrical conductors such as copper for low speed signals and power signals, and optical fibers for high speed signals and optical signals. The electro-optical circuit may also include, for example, one or more of optical mirrors, lenses, and/or other components, which may be operated by electrical signals generated by the electrical circuit. Optical fibers 320 may be configured to transport light emitted from the light emitting source (e.g., 122, shown in FIG. 3) to the electro-optical circuit. The electro-optical circuit may be configured to receive the input signals, process the received input signals based on a pre-determined function and generate an aggregate output signal 150 based on the received input signals.

In some embodiments, test circuit 140 may further be configured to receive additional input signals or instructions to determine a logic combination to be implemented. The instructions to determine the logic combination to be implemented may be generated by an external circuit (not shown) connected to test circuit 140. External circuit may be connected to test circuit 140 directly through a wired connection or remotely through a wireless communication. In some embodiments, the external circuit may be operated by a user/tester or a software program designed to generate specific outputs. For example, external circuit may generate a signal configured to instruct test circuit 140 to display a specific character. The logic combiner would identify and activate the specific segments of a multi-segment display that constitute the desired specific character.

In some embodiments, output signal 150 may include an aggregate signal indicating a pass/fail output of the device being tested, for example, display 120. Test circuit 140 may be configured to generate a desired output. For example, an AND gate may be employed if the desired output for display 120 is an aggregate pass/fail indicator. In other embodiments, specific patterns of displays may need to be tested. The specific patterns may include, for example, a character on a multi-segmented LED display, a shape on a dot matrix display, a pattern on a PCB, etc. Display driver 110 may be configured to operate and/or control the light emitting sources contributing to generate the character, the shape, or the pattern to be tested and test circuit 140 may be configured to generate the output signal in a desired output format.

In some embodiments, output signal 150 may include an indication of a total number of LEDs or light sources that have been tested. For example, in a seven-segment display, five out of seven segments may need to be activated to display the number 3, each segment being an individual LED. If, for example, the output signal 150 indicates that four LEDs are activated, the display may be tested further to determine exactly which of the LEDs may be non-functional. In other embodiments, wherein display 120 may be a PCB including a pre-determined and known number of LEDs mounted, output signal 150 may comprise an actual number of activated LEDs.

In some embodiments, output signal 150 may include visual indicators. For example, output signal 150 may activate a green LED indicating a pass or a red LED indicating a fail. Output signal 150 may also include audio, audio-visual, or haptic indications, or combinations thereof. In other embodiments, output signal 150 may include an electrical signal that may be further used as an input signal for a different circuit or for different elements in test circuit 140.

Figure 6:
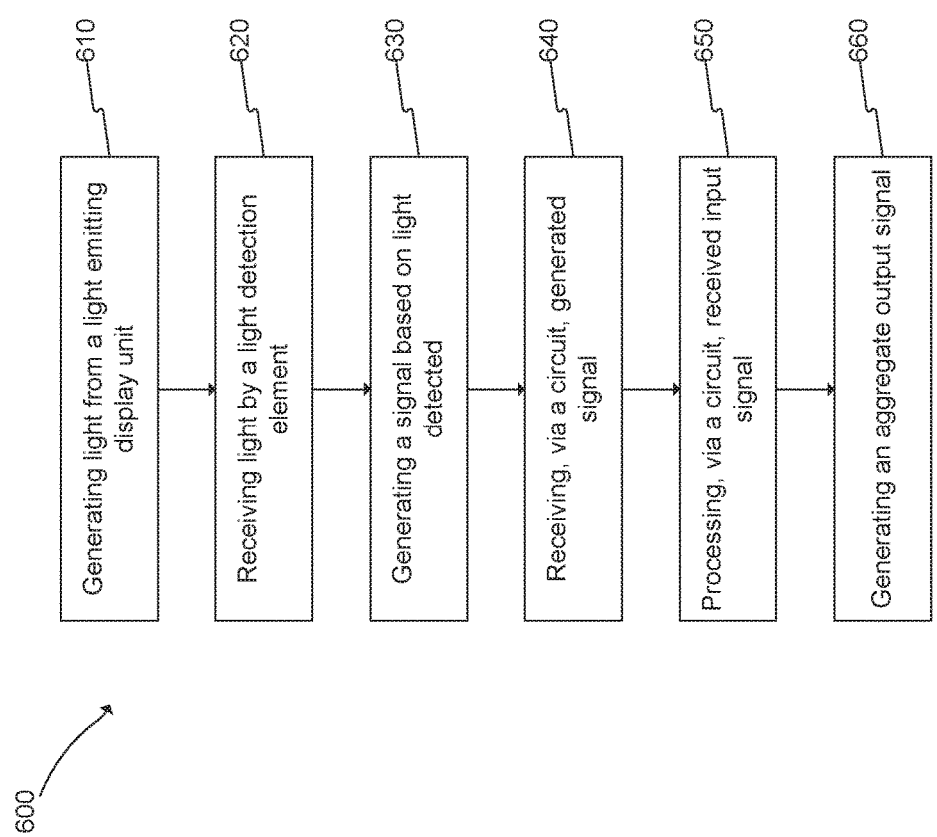
FIG. 6 is a flow chart illustrating an exemplary method of testing multi-element lighted displays, consistent with disclosed embodiments.

One aspect of the present disclosure is directed to a method for testing multi-element lighted displays (e.g., 120 shown in FIG. 2). FIG. 6 is a process flowchart illustrating an exemplary method of testing multi-element lighted displays, in accordance with the disclosed embodiments. The order and arrangement of steps in process 600 is provided for purposes of illustration. As will be appreciated from this disclosure, modifications may be made to process 600 by, for example, adding, combining, removing, and/or rearranging the steps for process 600.

An exemplary method of testing multi-element lighted displays may include generating light from a light emitting display unit or a multi-element lighted display, as shown in step 610. For example, light may be generated by one or more light emitting elements (e.g., 122, 124, 126, and 128) or LEDs mounted on a PCB or PCBA, or LEDs representing individual segments of a multi-segmented display, or LCDs representing individual segments of a multi-segmented display. In some embodiments, light may be generated by display 120, which may include light emitting elements configured to emit light of a variety of wavelengths, frequency, intensity etc.

In step 620, light detection elements (e.g. 132, 134, 136, or 138) may be configured to receive light emitted by the light emitting elements ((e.g., 122, 124, 126, and 128) of display 120. The emitted light may be collected and transported to light detection elements (e.g. 132, 134, 136, or 138) through light collectors such as optical fibers 320 having source ends 322 positioned nearer to the light emitting surface 123 of light emitting element (e.g., 122) and detector end 324 nearer to light detecting surface 133 of light detection element 132.

In some embodiments, emitted light may be received by the light detection elements (e.g. 132, 134, 136, or 138) without the optical fibers 320. For example, light detection elements (e.g., 132, 134, 136, or 138) may be positioned at optimum distance 135 from light emitting elements, (e.g., 124, 126, and 128) such that a majority of the light emitted by the light emitting elements (e.g. 122, 124, 126, or 128) is captured without interference from light emitted from a neighboring light emitting element (e.g., LED 124). In other embodiments, optical fibers (e.g., 320) may be configured to collect and transport light from light emitting elements (e.g. 122, 124, 126, or 128) to light detection elements (e.g. 132, 134, 136, or 138).

Step 630 includes generating a signal based on light detected by the light detection elements (e.g. 132, 134, 136, or 138). For example, photodetectors such as phototransistors (e.g., 432, 434, 436, or 438) may generate the signal by converting light received into electrical energy as output. The output signal of the photodetectors may be an electrical signal, for example, a voltage or a current signal. The characteristics of electrical signal generated may be based on the characteristics of the intensity, wavelength, or frequency of the light detected by the light detection elements (e.g. 132, 134, 136, or 138).

In step 640, test circuit 140 may receive the signals generated by the light detection elements (e.g. 132, 134, 136, or 138). For example, phototransistors (e.g. 432, 434, 436, or 438) may be electrically connected to test circuit 140 or multiplexer 510 through electrical connectors (433, 435, 437, and 439), which may transmit the generated signals to test circuit 140 or multiplexer 510. The generated signals received from the light detection elements (e.g., 132, 134, 136, or 138) may comprise input signals for test circuit 140. In some embodiments, test circuit 140 may include combinational logic, including AND gates, OR gates, NOR gates, NAND gates, multiplexers, or encoders-decoders. In these exemplary embodiments, test circuit 140 may also receive input signals or instructions to determine the logic combination to be implemented. The instructions to determine the logic combination to be implemented may be generated by an external circuit (not shown) connected to test circuit 140. For example, external circuit may generate a signal configured to instruct test circuit 140 to display a specific character.

In step 650, test circuit 140 may be configured to process the received input signals based on a pre-determined function. For example, test circuit 140 may determine wavelengths, intensities, frequencies, etc., of light emitted by LEDs (e.g., 422, 424, 426, and 428) on one or more printed circuit boards. In some embodiments, test circuit 140 may be configured to process the input signals based on discrete implementation of combinational logic. In these exemplary embodiments, based on the received instructions, the logic combiner or test circuit 140 may identify and activate the specific segments of multi-segment display 120 that constitute the desired character In step 660, test circuit 140 may generate an aggregate output signal 150 based on the processing of input signals. For example, output signal 150 may comprise an aggregate signal indicating a pass/fail output of display 120 being tested. In other embodiments, output signal 150 may include an indication of a total number of LEDs or light emitting elements (e.g., 122, 12, 126, and 128) that have been tested. For example, in a seven-segment display, five out of seven segments may need to be activated to display the number 3, each segment being an individual LED. In other embodiments, wherein display 120 may be a PCB including a pre-determined and known number of LEDs mounted, output signal 150 may comprise an actual number of activated LEDs.

The foregoing descriptions have been presented for purposes of illustration and description. They are not exhaustive and are not limited to the precise forms or embodiments disclosed. Modifications and adaptations will be apparent to those skilled in the art from consideration of the specification and practice of the disclosed embodiments. For example, the described implementation includes software but embodiments of the disclosure may be implemented as a combination of hardware and software or in hardware alone.

Other embodiments of the invention will be apparent to those skilled in the art from consideration of the specification and practice of the embodiments disclosed herein. The specification and examples should be considered as exemplary only, with a true scope and spirit of the disclosure being indicated by the following claims.

What is claimed is:

1. A system for testing a light emitting display unit having a plurality of light emitting elements, the system comprising:
  a test fixture, including:
  a plurality of light detection elements, the light detection elements being configured to generate signals upon detection of light emitted from the light emitting element, wherein the test fixture is movable towards or away from the light emitting elements to maintain a pre-determined distance between the test fixture and one or more of the light emitting elements based on an intensity of the generated signals; and
  a circuit configured to:
    receive input signals from the light detection elements;
    process the input signals based on a pre-determined function of the circuit and discrete implementation of a combinational logic, wherein the pre-determined function includes determining wavelength of the light emitted from the light emitting elements; and
    generate an aggregate output signal based on the processing of the input signals, wherein the aggregate output signal is configured to determine whether the light emitting display unit is functioning.

2. The system of claim 1, wherein the aggregate output signal is further configured to indicate a characteristic of the tested light emitting display unit.

3. The system of claim 1, wherein the circuit is further configured to receive instructions determining the combinational logic to be implemented.

4. The system of claim 1, wherein the aggregate output signal comprises an electrical signal or an optical signal.

5. The system of claim 1, wherein the test fixture further comprises a plurality of light collectors configured to transport light emitted from each of the plurality of light emitting elements to the plurality of light detection elements.

6. The system of claim 1, wherein the test fixture comprises a circuit board, a printed circuit board, or a printed circuit board assembly.

7. The system of claim 6, wherein the circuit board, during testing, is positioned such that each light detection element of the plurality of light detection elements of the test fixture is aligned with a corresponding light emitting element.

8. The system of claim 1, wherein the circuit comprises an electronic circuit or an optical circuit.

9. The system of claim 8, wherein the electronic circuit comprises a combinational logic circuit, a field-programmable gate array including one or more logic gates, a multiplexer, a programmable logic device, or a microprocessor.

10. The system of claim 1, wherein the plurality of light detection elements comprises phototransistors, photodiodes, photobipolar transistors, or photomultiplier tubes.

11. A method for testing a light emitting display unit having a plurality of light emitting elements and a test fixture, the method comprising:
  generating a signal from a plurality of light detection elements upon detection of light emitted from the light emitting element, wherein the test fixture is movable towards or away from the light emitting elements to maintain a pre-determined distance between the test fixture and one or more of the light emitting elements based on an intensity of the generated signals;
  receiving, via a circuit, input signals from the light detection elements;
  processing, via the circuit, the input signals based on a pre-determined function of the circuit and discrete implementation of a combinational logic, wherein the pre-determined function includes determining wavelength of the light emitted from the light emitting elements; and
  generating, via the circuit, an aggregate output signal based on the processing of the input signals, wherein the aggregate output signal is configured to determine whether the light emitting display unit is functioning.

12. The method of claim 11, further comprising processing the input signals based on discrete implementation of a combinational logic.

13. The method of claim 11, further comprising receiving instructions determining the combinational logic to be implemented.

14. The method of claim 11, wherein the aggregate output signal is configured to indicate a characteristic of the tested light emitting display unit.

15. The method of claim 11, wherein the aggregate output signal comprises an electrical signal or an optical signal.

16. The method of claim 11, further comprising aligning each light detection element of the plurality of light detection elements with the corresponding light emitting element.

17. The method of claim 11, wherein the circuit comprises an electronic circuit having a combinational logic circuit.

18. The method of claim 11, wherein the plurality of light detection elements comprises phototransistors, photodiodes, photobipolar transistors, or photomultiplier tubes.

19. A system for testing light emitting display unit having a plurality of light emitting elements and a test fixture, the system comprising:
- a plurality of light detection elements, the light detection elements being configured to generate signals upon detection of light emitted from the light emitting element, wherein the test fixture is movable towards or away from the light emitting elements to maintain a pre-determined distance between the test fixture and one or more of the light emitting elements based on an intensity of the generated signals; and
- a combinational logic circuit, the combinational logic circuit configured to:
  - receive input signals, the input signals including electrical signals generated from each of the plurality of light detection elements;
  - process the input signals based on a pre-determined function of the combinational logic circuit and discrete implementation of a combinational logic, wherein the pre-determined function includes determining wavelength of the light emitted from the light emitting elements; and
  - generate an aggregate output signal based on the processing of the input signals, wherein the aggregate output signal is configured to determine whether the light emitting display unit is functioning.

* * * * *